United States Patent
Cha et al.

(10) Patent No.: US 12,356,794 B2
(45) Date of Patent: Jul. 8, 2025

(54) DISPLAY APPARATUS

(71) Applicant: LG DISPLAY CO., LTD., Seoul (KR)

(72) Inventors: Eonho Cha, Paju-si (KR); Huiseong Yu, Paju-si (KR); MyungJae Yoo, Paju-si (KR); Yoonseok Lee, Paju-si (KR); GyuHyeong Han, Paju-si (KR); Hyejin Kim, Paju-si (KR)

(73) Assignee: LG Display Co., Ltd. (KR)

( * ) Notice: Subject to any disclaimer, the term of this patent is extended or adjusted under 35 U.S.C. 154(b) by 639 days.

(21) Appl. No.: 17/549,116

(22) Filed: Dec. 13, 2021

(65) Prior Publication Data

US 2022/0209176 A1 Jun. 30, 2022

(30) Foreign Application Priority Data

Dec. 24, 2020 (KR) .................. 10-2020-0183685

(51) Int. Cl.
*H10K 50/842* (2023.01)
*H10K 50/86* (2023.01)
*H10K 59/80* (2023.01)
*H10K 59/122* (2023.01)
*H10K 59/124* (2023.01)
(Continued)

(52) U.S. Cl.
CPC ....... *H10K 50/8426* (2023.02); *H10K 50/865* (2023.02); *H10K 59/8722* (2023.02); *H10K 59/122* (2023.02); *H10K 59/124* (2023.02); *H10K 59/38* (2023.02); *H10K 59/873* (2023.02);
(Continued)

(58) Field of Classification Search
CPC .......... H10K 50/8426; H10K 50/8428; H10K 59/8722; H10K 59/122
See application file for complete search history.

(56) References Cited

U.S. PATENT DOCUMENTS 8,854,717 B2 10/2014 Kim et al.
10,734,595 B2 8/2020 Um et al.
(Continued)

FOREIGN PATENT DOCUMENTS

JP 2016-118651 A 6/2016
KR 2013-0084857 A 7/2013
(Continued)

OTHER PUBLICATIONS

Taiwanese Office Action dated Jul. 26, 2022 issued in counterpart Patent Application No. 110143291 w/English Translation (5 pages).
(Continued)

*Primary Examiner* — Eric K Ashbahian
(74) *Attorney, Agent, or Firm* — Fish & Richardson P.C.

(57) ABSTRACT

A display apparatus includes a first substrate in which a display area and a non-display area surrounding the display area are defined, a second substrate facing the first substrate and overlapping with the first substrate, a lower inner dam disposed on the first substrate and surrounding the display area, an upper inner dam disposed on the second substrate and surrounding the display area, a lower passivation layer covering the lower inner dam, and an upper passivation layer covering the upper inner dam, wherein the lower passivation layer and the upper passivation layer are in contact with each other in an area where the lower inner dam and the upper inner dam overlapping with each other.

20 Claims, 3 Drawing Sheets

(51) Int. Cl.
 *H10K 59/38* (2023.01)
 *H10K 102/10* (2023.01)
(52) U.S. Cl.
 CPC ..... *H10K 59/874* (2023.02); *H10K 2102/103* (2023.02)

(56) References Cited

U.S. PATENT DOCUMENTS

| | | | |
|---|---|---|---|
| 2015/0060810 A1* | 3/2015 | Han | H10K 59/122 257/40 |
| 2016/0178943 A1* | 6/2016 | Hyodo | G02F 1/133345 349/43 |
| 2017/0229664 A1* | 8/2017 | Watabe | H10K 50/8426 |
| 2019/0058021 A1* | 2/2019 | Kim | H10K 59/122 |
| 2019/0363275 A1* | 11/2019 | Ochi | G09F 9/301 |
| 2021/0135147 A1* | 5/2021 | Wang | H10K 50/841 |
| 2022/0157893 A1* | 5/2022 | Baek | H10K 59/38 |

FOREIGN PATENT DOCUMENTS

| | | |
|---|---|---|
| KR | 2017-0025916 A | 3/2017 |
| KR | 10-2017-0071282 A | 6/2017 |
| KR | 10-2019-0065757 A | 6/2019 |
| KR | 2020-0076911 A | 6/2020 |
| KR | 10-2020-0118316 A | 10/2020 |
| TW | 201337394 A | 9/2013 |

OTHER PUBLICATIONS

Korean Office Action dated Aug. 19, 2024 issued in Patent Application No. 10-2020-0183685 (8 pages).

* cited by examiner

DISPLAY APPARATUS

CROSS-REFERENCE TO RELATED APPLICATION

This application claims the priority of the Korean Patent Application No. 10-2020-0183685 filed on Dec. 24, 2020, which is hereby incorporated by reference in its entirety.

BACKGROUND

Field of the Disclosure

The present disclosure relates to a display apparatus, and more particularly, to a display apparatus including an inner dam, a sealing dam, and an outer dam configured to surround a display area.

Description of the Background

The display apparatus has a high response speed and a low power consumption, and does not require a separate light source, unlike a liquid crystal display device. Thus, there is no problem in a viewing angle and is subject to a next generation flat panel display apparatus.

The display apparatus displays an image through a light emission of a light emitting device including a light emitting layer interposed between two electrodes. At this time, light generated according to an emission of an electroluminescent device is emitted to the outside through an electrode and a substrate.

A typical display apparatus forms a dam and a filling layer to prevent external oxygen or moisture from permeating, thereby preventing external oxygen or moisture from permeating. However, when first and second substrates of the display apparatus are attached to each other, bubbles generated in the filling layer are visible to cause a reliability problem due to an external defect, or a large area of the dam in a non-display area is occupied to prevent moisture permeation so that it is difficult to form a display apparatus having a narrow bezel.

SUMMARY

The present disclosure is made in view of the above problems and to provide a display apparatus capable of minimizing problems related with visible bubble defects generated in a panel by improving spreadability of a filling layer.

In accordance with an aspect of the present disclosure, the above and other features can be accomplished by the provision of a display apparatus which minimizes defects caused when a filling layer is permeated into a sealing dam, and enables improved lifespan of the apparatus.

In accordance with another aspect of the present disclosure, there is provided a display apparatus comprising a first substrate in which a display area and a non-display area surrounding the display area are defined, a second substrate confronting the first substrate and overlapping the first substrate, a lower inner dam formed on the first substrate and configured to surround the display area, an upper inner dam formed on the second substrate and configured to surround the display area, a lower passivation layer covering the lower inner dam, and an upper passivation layer covering the upper inner dam, wherein the lower passivation layer and the upper passivation layer are in contact with each other in an area where the lower inner dam and the upper inner dam are overlapped with each other.

Detailed description of the various examples of the present disclosure other than solving means of the problem mentioned above are included in the following description and the drawings.

BRIEF DESCRIPTION OF THE DRAWINGS

The above and other features and advantages of the present disclosure will be more clearly understood from the following detailed description taken in conjunction with the accompanying drawings.

In the drawings.

DETAILED DESCRIPTION

Figure 1:
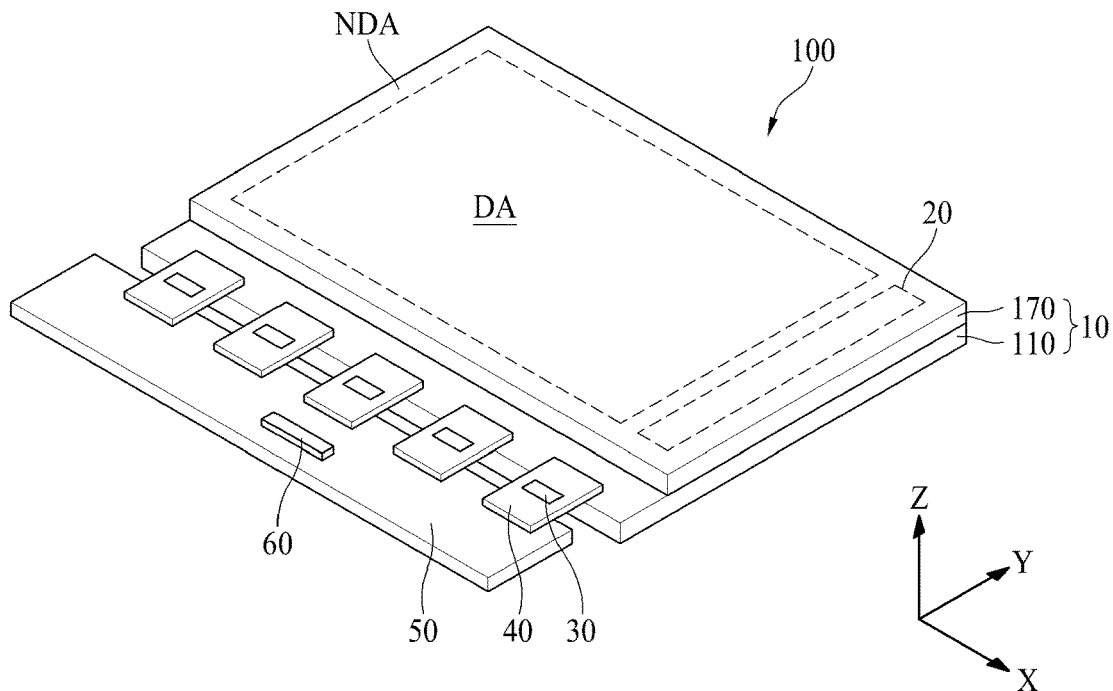
FIG. 1 is a perspective view illustrating a display apparatus according to an aspect of the present disclosure.

Advantages and features of the present disclosure, and implementation methods thereof will be clarified through following aspects described with reference to the accompanying drawings. The present disclosure can, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present disclosure are used, another part can be added unless 'only-' is used. The terms of a singular form can include plural forms unless referred to the contrary.

In describing a positional relationship, for example, when a position relation between two parts is described as 'on-', 'over-', 'under-' and 'next-', one or more other parts can be disposed between the two parts unless 'just' or 'direct' is used.

In describing a time relationship, for example, when the temporal order is described as 'after-', 'subsequent-', 'next-', and 'before-' a case which is not continuous can be included unless 'just' or 'direct' is used.

It will be understood that, although the terms "first," "second," and the like can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure can be partially or overall coupled to or combined with each other, and can be variously inter-operated with each other and driven technically as those skilled in the art can sufficiently understand. The aspects of the present disclosure can be carried out independently from each other, or can be carried out together in a co-dependent relationship.

Hereinafter, aspects of the present disclosure will be described in detail with reference to the accompanying drawings.

FIG. 1 is a perspective view illustrating a display apparatus according to one aspect of the present disclosure.

Referring to FIG. 1, a display apparatus 100 according to one aspect of the present disclosure includes a display panel 10, a gate driver 20, a source driver 30, a flexible film 40, a circuit board 50, and a controller 60.

The display panel 10 may include a first substrate 110 and a second substrate 170. The first substrate 110 may be a pixel array substrate, and the second substrate 170 may be a color filter substrate or an encapsulation substrate. Gate lines, data lines, and pixels may be formed on one surface of the first substrate 110 facing the second substrate 170. The pixels may be formed in a region defined by a crossing structure of the gate lines and the data lines. According to the present disclosure, the first substrate 110 and the second substrate 170 of the display panel 10 may be prepared by a separate process, and then may be bonded to each other.

Each of the pixels may include a thin film transistor, and an organic light emitting device having an anode electrode, an organic light emitting layer and a cathode electrode. Each of the pixels supplies a predetermined current to the organic light emitting device according to a data voltage of the data line when a gate signal is inputted from the gate line using the thin film transistor. As a result, the organic light emitting device in each of the pixels can emit light with a predetermined brightness according to a predetermined current. The structure of each of the pixels will be described later with reference to FIG. 4.

As shown in FIG. 1, the display panel 10 may be divided into a display area DA configured to display an image, and a non-display area NDA that does not display an image. The Gate lines, data lines, and pixels may be formed in the display area DA. The gate driver 20 and pads may be formed in the non-display area NDA.

The gate driver 20 supplies gate signals to the gate lines according to a gate control signal input from the controller 60. The gate driver 20 may be formed in a gate driver in panel (GIP) manner at one side of the display area DA of the display panel 10 or at both sides of the non-display area NDA. Alternatively, the gate driver 20 may be manufactured as a driving chip to be mounted on the flexible film and attached to one side of the display area DA of the display panel 10 or at both sides of the non-display area NDA in a tape automated bonding (TAB) manner.

The source driver 30 receives digital video data and a source control signal from the controller 60. The source driver 30 converts the digital video data into analog data voltages according to the source control signal, and supplies the analog data voltages to the data lines. When the source driver 30 is manufactured as a driving chip, the source driver 30 may be mounted on the flexible film 40 in a chip on film (COF) or a chip on plastic (COP) method.

Pads such as data pads may be formed in the non-display area NDA of the display panel 10. Wires connecting the pads and the source driver 30 and wires connecting the pads and the wirings of the circuit board 50 may be formed on the flexible film 40. The flexible film 40 is attached onto the pads using an anisotropic conducting film, thereby connecting the pads and the wires of the flexible film 40.

The circuit board 50 may be attached to the flexible films 40. The circuit board 50 may be mounted with a plurality of circuits implemented as driving chips. For example, the controller 60 may be mounted on the circuit board 50. The circuit board 50 may be a printed circuit board or a flexible printed circuit board.

The controller 60 receives digital video data and timing signals from an external system board through a cable of the circuit board 50. The controller 60 generates a gate control signal configured to control the operation timing of the gate driver 20 and a source control signal configured to control the source driver 30 based on the timing signal. The controller 60 supplies the gate control signal to the gate driver 20 and supplies the source control signal to the source drivers 30.

Figure 2:
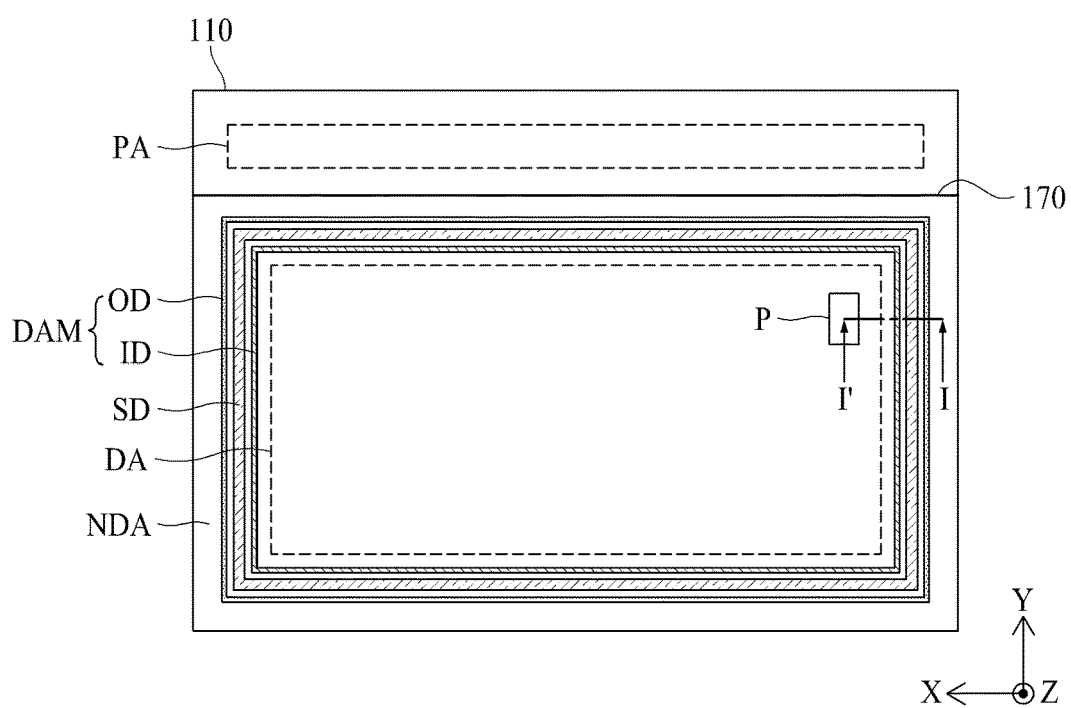
FIG. 2 is a plan view schematically illustrating a first substrate according to an aspect of the present disclosure.
Figure 3:
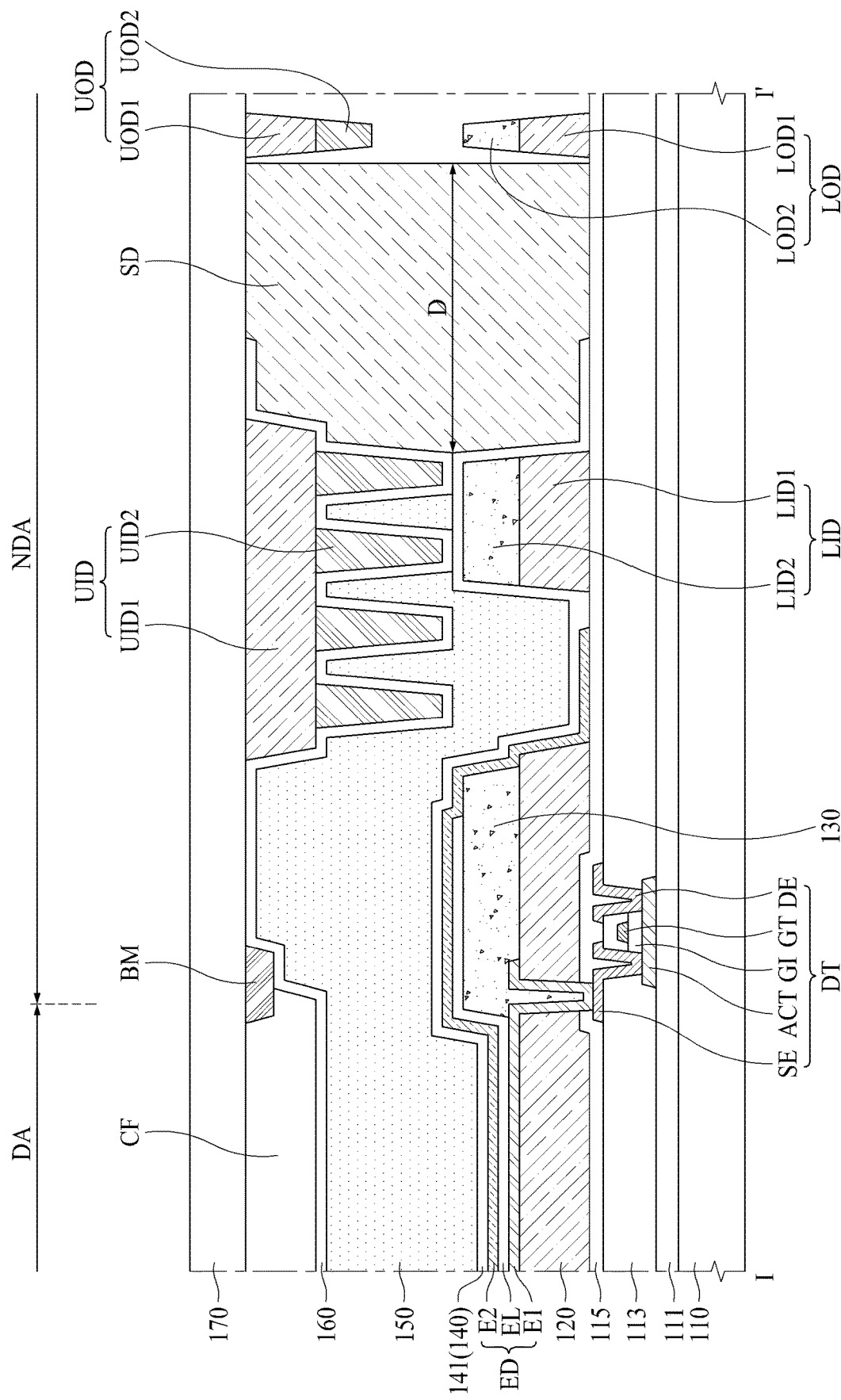
FIG. 3 is a cross-sectional view illustrating one example along I-I' of FIG. 2.

FIG. 2 is a plan view schematically illustrating the first substrate according to one aspect of the present disclosure, and FIG. 3 is a cross sectional view illustrating one example along I-I' of FIG. 2.

Referring to FIG. 2, the first substrate 110 and the second substrate 170 may include the display area DA, at least one pixel P disposed in the display area DA, and a pad area PA provided on one side of the non-display area NDA surrounding the display area DA in the area being overlapped with each other, and may include an inner dam ID, a sealing dam SD, and an outer dam OD in order to surround the display area DA in the non-display area NDA. The pad area PA of FIG. 2 may be a region in which the flexible film 40 shown in FIG. 1 is mounted on the first substrate 110.

Referring to FIG. 3, the display panel 10 according to one aspect of the present disclosure includes the first substrate 110, the second substrate 170 which confronts the first substrate 110, a driving thin film transistor DT provided on the first substrate 110, a planarization layer 120 disposed on the first substrate 110, an electroluminescent device ED disposed on the planarization layer 120, a filling layer 150 disposed between the first substrate 110 and the second substrate 170, a lower dam LD disposed on the first substrate 110, an upper dam UD disposed on the second substrate 170, and a sealing dam SD disposed between the inner dam ID and the outer dam OD.

The first substrate 110 may be made of a glass material, but may be made of a transparent plastic material, for example, polyimide, which can be bent or curved. When the plastic material is used as a material of the first substrate 110, polyimide having excellent heat resistance that can withstand high temperatures can be used since a high-temperature deposition process is performed on the first substrate 110. An entire front surface of the first substrate 110 may be covered by a buffer layer 111.

The buffer layer 111 prevents the material contained in the first substrate 110 from diffusing into a transistor layer during the high temperature process in the manufacturing process of the thin film transistor. Also, the buffer layer 111 may serve to prevent external moisture or moisture from penetrating into the light emitting device. For example, the buffer layer 111 may be formed of a multi-layer in which one or more inorganic layers of a silicon oxide layer, a silicon nitride layer, and a silicon oxynitride layer are stacked. Alternatively, the buffer layer 111 may be omitted.

Each pixel P may include a circuit device including a capacitor and a thin film transistor, and a light emitting device. The thin film transistor may include a switching thin film transistor, a sensing thin film transistor, and a driving thin film transistor DT.

The switching thin film transistor is switched according to the gate signal supplied to the gate line to supply the data voltage supplied from the data line to the driving thin film transistor DT.

The sensing thin film transistor senses a threshold voltage deviation of the driving thin film transistor DT, which is a cause of image quality degradation.

The driving thin film transistor DT is switched according to the data voltage supplied from the switching thin film transistor, generates a data current from a power source supplied from a pixel power line, and supplies the data current to the first electrode E1 of the electroluminescent device ED.

The driving thin film transistor DT may be formed on the buffer layer 111 and may be disposed to correspond to each of the pixels P to be electrically connected to the electroluminescent device ED. According to one aspect, the driving thin film transistor DT may include an active layer ACT, a gate electrode GE, a source electrode SE, and a drain electrode DE. Also, although the driving thin film transistor DT shown in FIG. 3 is shown as a top gate structure, the aspect of the present disclosure is not limited thereto, and various structures known in the art may be applied to the driving thin film transistor DT. In this specification of the present disclosure, the thin film transistor having the top gate structure will be described in detail.

The active layer ACT may be prepared on the buffer layer 111. The active layer ACT may be disposed to overlap the gate electrode GE, the source electrode SE, and the drain electrode DE, and the active layer ACT may include a channel region and a source/drain region. And, the active layer ACT may be formed such that the channel region overlaps the gate electrode GE in the center of the active layer ACT, and the source/drain region may be formed in parallel with each other with the channel region therebetween. Further, a gate insulating layer GI may be provided between the active layer ACT and the gate electrode GE. Specifically, the gate insulating layer GI may be disposed between the channel region of the active layer ACT and the gate electrode GE, to thereby insulate the active layer ACT and the gate electrode GE from each other. The gate electrode GE may overlap the channel region of the active layer ACT with the gate insulating layer GI interposed therebetween. The active layer ACT may be formed of a silicon-based semiconductor material or an oxide-based semiconductor material.

The gate insulating layer GI may be provided on the active layer ACT and may be disposed on the buffer layer 111. Also, the gate insulating layer GI may insulate the active layer ACT and the gate electrode GE from each other. The gate insulating layer GI may include a silicon nitride (SiNx) layer or a silicon oxide (SiOx) layer, but not limited to these layers.

The gate electrode GE may be formed on the gate insulating layer GI. The gate electrode GE may be formed of a single layer or multiple layers made of one of molybdenum (Mo), aluminum (Al), chrome (Cr), gold (Au), titanium (Ti), nickel (Ni), neodymium (Nd), and copper (Cu).

An insulating interlayer 113 may be formed on the gate electrode GE and the gate insulating layer GI. The insulating interlayer 113 may protect the driving thin film transistor DT. The insulating interlayer 113 may be removed in order to make a contact between the active layer ACT and the source electrode SE or the active layer ACT and the drain electrode DE. For example, the insulating interlayer 113 may include a contact hole exposing a source region of the active layer ACT contacting the source electrode SE, and a contact hole exposing a drain region of the active layer ACT contacting the drain electrode DE. Also, the insulating interlayer 113 may be formed on the gate insulating layer GI. According to one aspect, the insulating interlayer 113 may include a silicon oxide (SiOx) layer or a silicon nitride (SiNx) layer, or the insulating interlayer 113 may include a plurality of layers including a silicon oxide (SiOx) layer and a silicon nitride (SiNx) layer.

The source electrode SE and the drain electrode DE according to one aspect of the present disclosure may be formed of a single layer or multi layers made of molybdenum (Mo), aluminum (Al), chrome (Cr), silver (Ag), gold (Au), titanium (Ti), nickel (Ni), neodymium (Nd), copper (Cu), or alloy thereof, and a transparent conductive oxide (TCO) such as indium tin oxide (ITO) or indium zinc oxide (IZO). In this specification of the present disclosure, the material for the source electrode SE and the drain electrode DE may be selected to satisfy the certain electrical characteristics required by the driving thin film transistor DT.

Also, the driving thin film transistor DT may further include a light shielding layer disposed under the active layer ACT of the driving thin film transistor DT. The light shielding layer may be disposed on the first substrate 110 while being overlapped with the driving thin film transistor DT. For example, the light shielding layer may be obtained by depositing a metal layer on the first substrate 110 and patterning the metal layer. The light shielding layer may be a single layer or a multilayer film made of a metal such as molybdenum (Mo), aluminum (Al), chrome (Cr), gold (Au), titanium (Ti), nickel (Ni), neodymium (Nd), and silver (Ag), or an alloy thereof, but may be implemented with various materials known in the art. The light shielding layer may include a lower light shielding layer and an upper light shielding layer.

A protection layer 115 may be formed on the insulating interlayer 113, the source electrode SE, and the drain electrode DE. The protection layer 115 may protect the source electrode SE and the drain electrode DE. The protection layer 115 may include a contact hole configured to expose the source electrode SE or the drain electrode DE. Herein, the contact hole of the protection layer 115 may be connected to the contact hole of the planarization layer 120 so that the first electrode E1 may contact the source electrode SE. The protection layer 115 may include a silicon oxide layer or a silicon nitride layer.

The planarization layer 120 may be disposed on the first substrate 110. The planarization layer 120 may overlap an emission area of the display area DA so that the emission area defined by the electroluminescent device ED and bank layer 130 is substantially flat. Also, the planarization layer 120 may be partially overlapped with at least a portion of a non-emission area except for the emission area of the display area DA. The planarization layer 120 may be formed of an organic film such as acrylic resin, epoxy resin, phenolic resin, polyamide resin, and polyimide resin.

The electroluminescent device ED may be disposed on the planarization layer 120, and emit light according to the data signal supplied from the driving thin film transistor DT to emit light toward the first substrate 110 and/or the second substrate 170.

The electroluminescent device ED according to one aspect of the present disclosure includes a first electrode E1, an electroluminescent layer EL, and a second electrode E2.

The first electrode E1 may be formed on the planarization layer 120, may overlap with the opening of each pixel P, and may overlap with at least a portion of a circuit portion CP.

The first electrode E1 may be disposed on the planarization layer 120 and may be electrically connected to the source electrode SE of the driving thin film transistor DT. The first electrode E1 may contact the source electrode SE of the driving thin film transistor DT through a contact hole provided in the planarization layer 120. The first electrode E1 according to one aspect of the present disclosure may include a transparent conductive material such as transparent conductive oxide (TCO) so that the light emitted from the electroluminescent device ED may be transmitted to the first substrate 110. For example, the first electrode E1 may be made of indium tin oxide (ITO) or indium zinc oxide (IZO). Also, the first electrode E1 according to one aspect of the present disclosure may include a metal material or a transparent conductive oxide. For example, the first electrode E1 may be formed of a metal material having a high reflectance, for example, a deposition structure of aluminum and titanium (Ti/Al/Ti), a deposition structure of aluminum and indium tin oxide (ITO/Al/ITO), Ag alloy, and a deposition structure of Ag alloy and ITO (ITO/Ag alloy/ITO). Herein, the Ag alloy may be an alloy such as silver (Ag), palladium (Pd), and copper (Cu), and may be referred to as an APC alloy.

The electroluminescent layer EL may be formed on the first electrode E1 to be in direct contact with the first electrode E1. The electroluminescent layer EL according to one aspect of the present disclosure may include any one of an organic light emitting layer, an inorganic light emitting layer, and a quantum dot light emitting layer, or may include a stacked or mixed structure of an organic light emitting layer (or an inorganic light emitting layer) and a quantum dot light emitting layer.

The electroluminescent layer EL according to one aspect of the present disclosure may include any one of a blue light emitting layer, a green light emitting layer, a red light emitting layer, and a white light emitting layer. For example, when a unit pixel includes first to fourth pixels, an electroluminescent layer EL disposed in the first pixel region may include a red light emitting layer, an electroluminescent layer EL disposed in the second pixel region may include a green light emitting layer, an electroluminescent layer EL disposed in the third pixel region may include a blue light emitting layer, and an electroluminescent layer EL disposed in the fourth pixel region may include a white light emitting layer, respectively. In this case, the electroluminescent layer EL in each of the first to fourth pixels may be disposed only on the first electrode E1 overlapped with the opening in each of the pixel regions.

The electroluminescent layer EL according to another aspect of the present disclosure includes two or more light emitting portions configured to emit white light. For example, when a unit pixel includes first to fourth pixels, each of the first to fourth pixels may include a first light emitting portion and a second light emitting portion for emitting white light by mixing the first light and the second light. The first light emitting portion according to one aspect of the present disclosure emits the first light, and may include any one of a blue light emitting portion, a green light emitting portion, a red light emitting portion, a yellow light emitting portion, and a yellowish green light emitting portion. The second light emitting portion according to one aspect of the present disclosure may include any one of a blue light emitting portion, a green light emitting portion, a red light emitting portion, a yellow light emitting portion, and a yellowish green light emitting portion except the first light emitting portion. In this case, the electroluminescent layer EL may be disposed only on the first electrode E1 that overlaps the opening of each pixel region as a common layer of each of the first to fourth pixels, but may be disposed to be overlapped with the circuit portion in each of the pixel regions.

Accordingly, the light emitting devices of the first to fourth pixels may emit the same white light. In this case, the first to fourth pixels may respectively include different wavelength conversion layers which convert white light into different color light. And, the fourth pixel may emit white light toward the first substrate 110 and/or the second substrate 170 without the wavelength conversion layer.

The second electrode E2 may be formed on the electroluminescent layer EL, and may be in direct contact with the electroluminescent layer EL. The second electrode E2 according to one aspect of the present disclosure may be a cathode electrode of the electroluminescent layer EL. The second electrode E2 according to one aspect of the present disclosure may include a metal material having a high reflectance so as to reflect light emitted from the electroluminescent layer EL toward the first substrate 110. For example, the second electrode E2 may be formed in a multi-layered structure of a deposition structure of aluminum and titanium (Ti/Al/Ti), a deposition structure of aluminum and indium tin oxide (ITO/Al/ITO), APC (Ag/Pd/Cu) alloy, and a deposition structure of APC alloy and ITO (ITO/APC/ITO), or may be formed in a single-layered structure made of any one material selected from silver (Ag), aluminum (Al), molybdenum (Mo), gold (Au), magnesium (Mg), calcium (Ca), barium (Ba), or alloy thereof.

Alternatively, a transparent conductive material such as a transparent conductive oxide (TCO) may be included to transmit the light emitted from the electroluminescent layer EL to the second substrate 170. For example, the second electrode E2 may be made of indium tin oxide (ITO) or indium zinc oxide (IZO).

The bank 130 defines the opening in each of the pixel regions, and may be provided on the edge of the first electrode E1 and the planarization layer 120, and may be prepared to be overlapped with the boundary between the display area DA and the non-display area NDA. For example, the bank 130 may be formed of an organic material such as benzocyclobutene (BCB)-based resin, acrylic resin, or polyimide resin. Alternatively, the bank 130 may be formed of a photosensitive agent including a black pigment. In this case, the bank 130 may serve as a light blocking member for preventing confusion between adjacent pixels.

Each of the electroluminescent layer EL of the electroluminescent device ED and the second electrode E2 may be formed on the bank 130. That is, the electroluminescent layer EL may be formed to cover the edge of the first electrode E1 and the bank 130, and the second electrode E2 may be formed to cover the electroluminescent layer EL.

A first lower passivation layer 141 may be formed on the first substrate 110 and may be provided to cover the second electrode E2, that is, the entire pixel. The first lower passivation layer 141 protects the thin film transistor and the electroluminescent device ED from an external shock, and serves to prevent oxygen, moisture, and particles from penetrating into the electroluminescent device ED.

The first lower passivation layer 141 may include a silicon nitride (SiNx) layer. The silicon nitride (SiNx) layer may have an excellent water vapor transmission rate (WVTR) so that it is possible to prevent a deterioration of reliability caused by a moisture permeation into the electroluminescent device ED. Also, when the first lower passivation layer 141 is formed of the silicon nitride layer, it is possible to prevent a degradation of reliability due to the moisture penetration of the electroluminescent device ED, whereby it is possible to reduce a width D of the sealing dam SD formed in the non-display area. Therefore, the display apparatus according to the present disclosure may realize a narrow bezel having a narrow non-display area.

For example, the first lower passivation layer 141 may be formed to a thickness of 0.05 to 1.5 μm, but is not limited thereto.

A lower passivation layer 140 may include the first lower passivation layer 141, and a second lower passivation layer 143, as described below in FIG. 4.

The filling layer 150 may be positioned between the lower passivation layer 140 and an upper passivation layer 160. For example, the filling layer 150 may be made of any one of acrylic resin, epoxy resin, phenolic resin, polyamide resin, polyimide resin, and benzocyclobutene resin. An organic encapsulation layer may be represented by a particle cover layer.

The filling layer 150 may be applied to a filling agent surrounding the entire display area. In this case, the display panel 10 according to the present disclosure further includes the second substrate 170 attached to the first substrate 110 via a filler. The second substrate 170 may be made of a plastic material, a glass material, or a metal material. The filler may include a getter material that absorbs oxygen and/or moisture.

Also, the non-display area NDA of the first substrate 110 may include a lower inner dam LID formed on the first substrate 110 to surround the display area DA, a lower outer dam LOD formed to surround the lower inner dam outside the lower inner dam, and a sealing dam SD positioned between the lower inner dam LID and the lower outer dam LOD.

The lower inner dam LID may be formed to surround the display area DA in the non-display area NDA on the first substrate 110, and may include a first lower inner dam LID1, and a second lower inner dam LID2 formed on the first lower inner dam LID1.

The first lower inner dam LID1 may be prepared in the same material and the same process as the planarization layer 120. For example, the first lower inner dam LID1 may be formed at a predetermined thickness through the same process when the planarization layer 120 is formed, and then the first lower inner dam LID1 and the planarization layer 120 may be formed to be distinguished from each other through the patterning process.

The second lower inner dam LID2 may be prepared in the same material and the same process as the bank 130. For example, the second lower inner dam LID2 may be formed at a predetermined thickness through the same process when the bank 130 is formed, and then the second lower inner dam LID2 and the bank 130 may be formed to be distinguished from each other through the patterning process.

The lower outer dam LOD is formed to surround the lower inner dam LID, wherein the lower outer dam LOD may include a first lower outer dam LOD1 formed on the first substrate 110, and a second lower outer dam LOD2 formed on the first lower outer dam LOD1.

The first lower outer dam LOD1 may be prepared in the same material and the same process as the first lower inner dam LID1. For example, the first lower outer dam LOD1 may be formed at a predetermined thickness through the same process when the first lower inner dam LID1 is formed, and then the first lower inner dam LID1 and the first lower outer dam LOD1 may be formed to be distinguished from each other through the patterning process.

The second lower outer dam LOD2 may be prepared in the same material and the same process as the second lower inner dam LID2, and then the second lower inner dam LID2 and the second lower outer dam LOD2 may be formed to be distinguished from each other through the patterning process after being prepared to a predetermined thickness through the same process when forming the second lower inner dam LID2.

The sealing dam SD may be positioned between the inner dam ID of the non-display area NDA and the outer dam OD of the non-display area NDA. The sealing dam SD may be formed of a material, wherein the material capable of absorbing moisture can be pulverized into a small size to be mixed, for example, an epoxy-based material, or an acryl-based or olefin-based material. The sealing dam SD may be disposed by the use of dispenser, and may be sealed between the first substrate 110 and the second substrate 170 through ultraviolet and thermal curing after bonding the two substrates.

A color filter CF may be disposed on the display area DA of the second substrate 170 and may be disposed to be overlapped with the electroluminescent device ED.

The display apparatus according to one aspect of the present disclosure may be a top emission type in which the color filter CF is disposed between the electroluminescent device ED and the second substrate 170. However, the scope of the present disclosure is not limited to a display apparatus with a bottom emission type, but may include both a display apparatus with a top emission type and a display apparatus with a two-way emission type. Hereinafter, for convenience of explanation, the display apparatus with the top emission type will be described.

In this case, a color filter CF1 overlapping one emission area and a color filter CF2 overlapping another emission area may be a color filter transmitting light of different colors, and may be one of a red color filter, a green color filter, and a blue color filter. However, aspects of the present disclosure are not limited thereto. In addition, the color filter CF may be omitted when the emission area including the electroluminescent device ED is a white emission area.

A black matrix BM may be disposed to surround one side of the color filter CF and may prevent one color filter CF from being mixed with another adjacent color filter CF, and may partition the plurality of color filters CF.

Also, the non-display area NDA of the second substrate 170 may include an upper inner dam UID formed on the second substrate 170 to surround the display area DA, an upper outer dam UOD formed to surround the upper inner dam UID outside the upper inner dam UID, and a sealing dam SD positioned between the upper inner dam UID and the upper outer dam UOD.

The upper inner dam UID may be formed to surround the display area DA on the non-display area NDA of the second substrate 170, and may include a first upper inner dam UID1, and a second upper inner dam UID2 formed on the first upper inner dam UID1.

At this time, the second upper inner dam UID2 may be prepared with a plurality of second upper inner dams UID2, which are spaced apart from each other. The second upper inner dam UID2 is prepared with a plurality of second upper inner dams UID2 spaced apart from each other, thereby preventing the filling layer 150 from penetrating into the sealing dam SD in the non-display area NDA.

The first upper inner dam UID may include the same material as the planarization layer 120. Accordingly, the first upper inner dam UID1 may be prepared in the same process as the process of preparing the planarization layer 120 of the first substrate 110 on the second substrate 170. In the present specification, since the first substrate 110 and the second substrate 170 are separately prepared and then bonded to each other, the first upper inner dam UID1 of the second substrate 170 may be prepared in a separate process from the planarization layer 120 of the first substrate 110. The first upper inner dam UID1 may be formed through a patterning process after the same material as the planarization layer 120 is prepared at a predetermined thickness.

The second upper inner dam UID2 may be made of the same material as the black matrix BM. For example, the second upper inner dam UID2 may be prepared with a black matrix BM and a first upper inner dam UID1 and then prepared with a plurality of second upper inner dams UID2 spaced apart from each other through a patterning process on the first upper inner dam UID1.

The upper outer dam UOD may be disposed to surround the upper inner dam UID, may include a first upper outer dam UOD1, and a second upper outer dam UOD2 formed on the first upper outer dam UOD1.

The first upper outer dam UOD1 may be prepared in the same material and the same process as the first upper inner dam UID1. For example, the first upper outer dam UOD1 may be formed to a predetermined thickness through the same process when forming the first upper inner dam UID1, and then the first upper inner dam UID1 and the first upper outer dam UOD1 may be formed to be distinguished from each other through the patterning process.

The second upper outer dam UOD2 may be prepared of the same material as the second upper inner dam UID2. For example, the second upper outer dam UOD2 may be formed to a predetermined thickness through the same process when forming the second upper inner dam UID2, and then the second upper inner dam UID2 and the second upper outer dam UOD2 may be formed to be distinguished from each other through the patterning process. Accordingly, the second upper outer dam UOD2 may include the same material as the black matrix BM.

The upper outer dam UOD may be disposed to surround the upper inner dam UID, and the upper outer dam UOD may include a first upper outer dam UOD1 formed on the second substrate 170, and a second upper outer dam UOD2 formed on the first upper outer dam UOD1.

The first upper outer dam UOD1 may be prepared in the same material as the first upper inner dam UID1, and the second upper outer dam UOD2 may be prepared in the same material as the second upper inner dam UID2 by the same process.

The upper passivation layer 160 may be formed on the second substrate 170, and may be configured to cover the color filter CF, the black matrix BM, and the upper inner dam UID formed on the second substrate 170. For example, the upper passivation layer 160 may include at least one of a silicon nitride (SiNx) layer, a silicon oxide (SiOx) layer, a silicon oxynitride (SiON) layer, and an aluminum oxide (Al2O3) layer. When the filling layer 150 is formed of an organic material, the silicon nitride (SiNx) layer, the silicon oxide (SiOx) layer, the silicon oxynitride (SiON) layer, and the aluminum oxide (Al2O3) layer may have a hydrophilic property so that it is possible to improve spreadability to the filling layer 150 formed of an organic material, thereby minimizing formation of bubbles in the display panel 10 when the first substrate 110 and the second substrate 170 are bonded to each other.

For example, the upper passivation layer 160 may be formed at a thickness of 1 but is not limited thereto.

According to another aspect of the present disclosure, the upper passivation layer 160 may include at least one of a silicon oxide (SiOx) layer and an aluminum oxide (Al2O3) layer, and may have higher hydrophilicity to the filling layer 150 in comparison to the silicon oxide (SiOx) layer and aluminum oxide (Al2O3) layer so that it is possible to improve spreadability of the filling layer 150 when bonding the first substrate 110 and the second substrate 170 to each other.

According to one aspect of the present disclosure, the lower inner dam LID provided on the first substrate 110 and the upper inner dam UID provided on the second substrate 170 may be provided to overlap at least a portion of each other, and the lower inner dam LID and the upper inner dam UID may be formed to contact at least a portion of each other. Herein, the contact indicates that the lower passivation layer 140 covering the lower inner dam LID contacts the upper passivation layer 160 covering the upper inner dam UID.

The sealing dam SD is positioned between the inner dam ID and the outer dam OD so as to bond the first substrate 110 and the second substrate 170 to each other, and can prevent moisture and oxygen permeability to the electroluminescent device ED from the outside at the maximum, thereby securing moisture-proof reliability.

Also, the second substrate 170 overlaps the first substrate 110, and the second substrate 170 may be prepared to have a size smaller than that of the first substrate 110. However, the size of the first substrate 110 and the second substrate 170 is not limited thereto, and the first substrate 110 and the second substrate 170 may have the same size or may be freely adjusted according to the design of the display apparatus.

Figure 4:
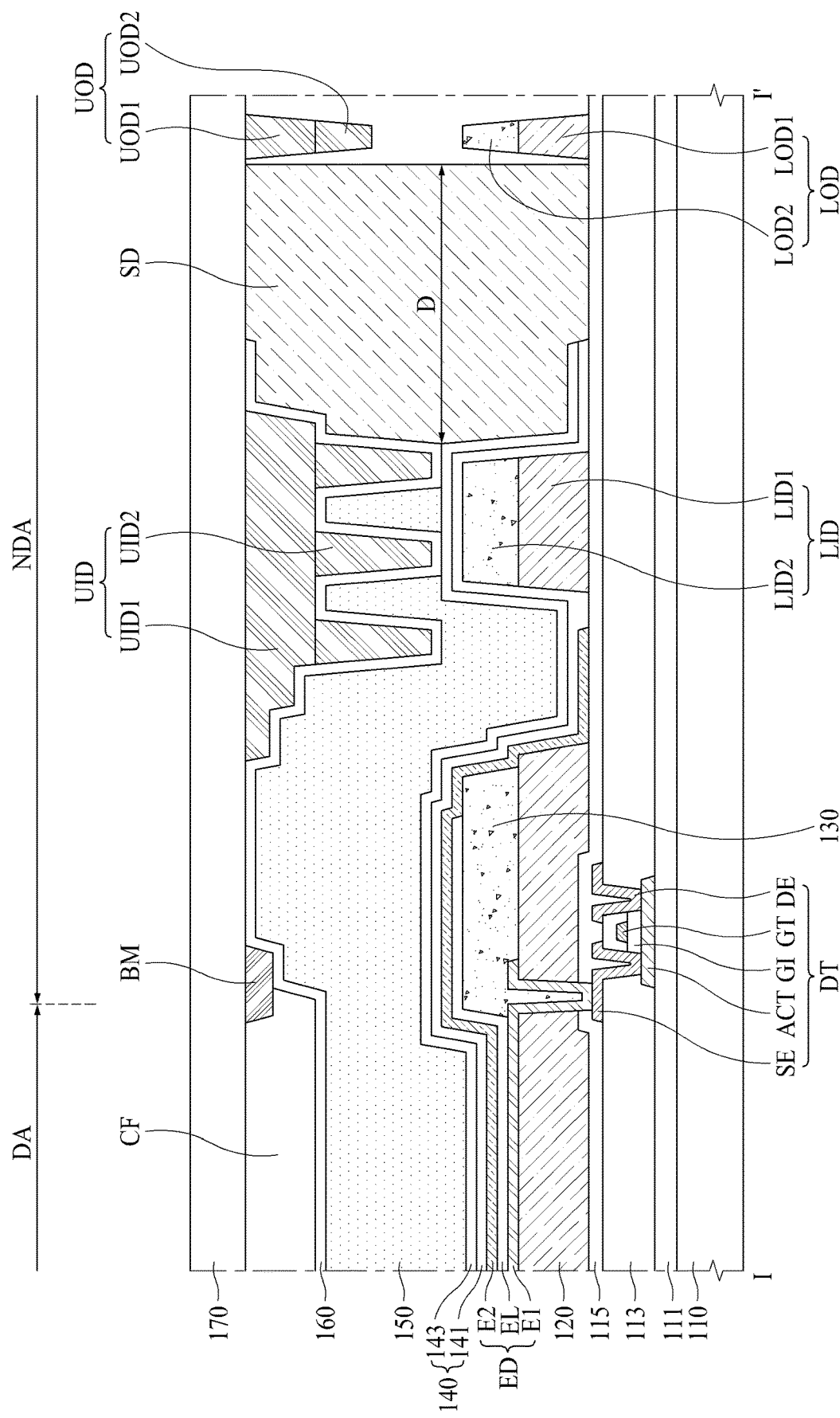
FIG. 4 is a cross-sectional view illustrating another example along I-I' of FIG. 2.

FIG. 4 is a cross sectional view illustrating another example along I-I' of FIG. 2. The structure of the display apparatus shown in FIG. 4 is the same as that of FIG. 3 except for the structure of the upper inner dam UID and the lower passivation layer 140, and thus a description thereof will be omitted.

Referring to FIG. 4, an upper inner dam UID may be formed to surround the display area DA on the non-display area NDA of the second substrate 170, and may include a first upper inner dam UID and a second upper inner dam UID2 formed on the first upper inner dam UID1. At this time, the second upper inner dam UID2 may be prepared with the plurality of second upper inner dams UID2 spaced apart from each other. The second upper inner dam UID2 is prepared with the plurality of second upper inner dams UID2 spaced apart from each other, thereby preventing the filling layer 150 from penetrating into the sealing dam SD in the non-display area NDA.

The first upper inner dam UID may be prepared of the same material as the black matrix BM by the same process. Also, the first upper inner dam UID may comprise a stepped structure having a predetermined step may be formed at a side facing the display area DA. The first upper inner dam UID1 has a stepped structure having a predetermined step at a side facing the display area DA, thereby controlling a fluidity of the filling layer 150 in the non-display area NDA and preventing a penetration of the filling layer 150 into the sealing dam SD.

The stepped structure of the first upper inner dam UID1 may be prepared through a plurality of deposition processes such that the first upper inner dam UID has a gradually smaller width in a process of forming the first upper inner dam UID1, or a plurality of patterning processes may be performed at a position corresponding to the stepped structure after the first upper inner dam UID is formed at a predetermined thickness. Herein, the patterning process may refer to the process including both a mask forming step and an etching step.

The lower passivation layer 140 may include a first lower passivation layer 141 covering the second electrode E2, and a second lower passivation layer 143 covering the first lower passivation layer 141.

According to one aspect of the present disclosure, the first lower passivation layer 141 may include a silicon nitride layer SiNx, and the second lower passivation layer 143 may include at least one of a silicon oxide (SiOx) layer, a silicon oxynitride (SiON) layer, and an aluminum oxide (Al2O3) layer.

The first lower passivation layer 141 may include a silicon nitride layer SiNx. The silicon nitride layer SiNx may have an excellent water vapor transmission rate (WVTR) to prevent moisture from permeating into the electroluminescent device ED, thereby preventing a deterioration of reliability. Also, when the first lower passivation layer 141 is formed of a silicon nitride layer, it is possible to prevent a degradation of reliability due to the moisture penetration to the electroluminescent device ED, whereby the width D of the sealing dam SD formed in the non-display area can be reduced. Therefore, the display apparatus according to the present disclosure can implement a narrow bezel having a narrow non-display area.

The second lower passivation layer 143 may include at least one of a silicon oxide (SiOx) layer, a silicon oxynitride (SiON) layer, and an aluminum oxide (Al2O3) layer. When the filling layer 150 is made of an organic material, the silicon oxide (SiOx) layer, the silicon oxynitride (SiON) layer, and the aluminum oxide (Al2O3) layer may have the higher hydrophilic property in comparison to the silicon nitride (SiNx) layer so that it is possible to improve to improve a spreadability to the filling layer 150 made of the organic material, to thereby minimize a formation of bubbles in the display panel 10 when the first substrate 110 and the second substrate 170 are bonded to each other.

For example, the first lower passivation layer 141 may be formed at a thickness of 0.05 to 0.2 μm, and the second lower passivation layer 143 may be formed at a thickness of 0.6 to 1.2 μm, but is not limited thereto.

The lower outer dam LOD may be configured to surround the lower inner dam LID, and the lower outer dam LOD may include a first lower outer dam LOD1 formed on the first substrate 110, and a second lower outer dam LOD2 formed on the first lower outer dam LOD1.

The first lower outer dam LOD1 may be prepared in the same material and the same process as the first lower inner dam LID1. For example, when forming the first lower inner dam LID1, the first lower inner dam LID1 and the first lower outer dam LOD1 may be prepared at a predetermined thickness by the same process, and then be formed to be distinguished from each other through the patterning process. Accordingly, the first lower outer dam LOD1 may include the same material as the planarization layer 120.

The second lower outer dam LOD2 may be prepared in the same material and the same process as the second lower inner dam LID2. For example, when forming the second lower inner dam LID2, the second lower inner dam LID2 and the second lower outer dam LOD2 may be prepared at a predetermined thickness by the same process, and then be formed to be distinguished from each other through the patterning process. Accordingly, the second lower outer dam LOD2 may include the same material as the bank 130.

The upper outer dam UOD may be configured to surround the upper inner dam UID, and the upper outer dam UOD may include a first upper outer dam UOD1, and a second upper outer dam formed UOD2 on the first upper outer dam UOD1.

The first upper outer dam UOD1 may be prepared by the same material and the same process as that of the first upper inner dam UID1. For example, when forming the first upper outer dam UOD1, the first upper inner dam UID and the first upper outer dam UOD1 may be prepared at a predetermined thickness by the same process, and then be formed to be distinguished from each other through the patterning process. Accordingly, the first upper outer dam UOD1 may include the same material as the black matrix BM.

The second upper outer dam UOD2 may be prepared by the same material and the same process as that of the second upper inner dam UID2. For example, when forming the second upper inner dam UID2, the second upper inner dam UID2 and the second upper outer dam UOD2 may be prepared at a predetermined thickness by the same process, and then be formed to be distinguished from each other through the patterning process. Accordingly, the second upper outer dam UOD2 may include the same material as the black matrix BM.

The upper outer dam UOD may be disposed to surround the upper inner dam UID, and the upper outer dam UOD may include the first upper outer dam UOD1 formed on the second substrate 170, and the second upper outer dam UOD2 formed on the first upper outer dam UOD1.

The first upper outer dam UOD1 may be prepared in the same material as the first upper inner dam UID1 by the same process, and the second upper outer dam UOD2 may be prepared in the same material as the second upper inner dam UID2 by the same process.

The display apparatus according to the present disclosure may be described as follows.

The display apparatus according to the aspect of the present disclosure comprises a first substrate in which a display area and a non-display area surrounding the display area are defined, a second substrate confronting the first substrate and overlapping the first substrate, a lower inner dam formed on the first substrate and configured to surround the display area, an upper inner dam formed on the second substrate and configured to surround the display area, a lower passivation layer covering the lower inner dam, and an upper passivation layer covering the upper inner dam, wherein the lower passivation layer and the upper passivation layer are in contact with each other in an area where the lower inner dam and the upper inner dam are overlapped with each other.

According to aspects of the present disclosure, the lower inner dam may include a first lower inner dam formed on the first substrate and configured to surround the display area, and a second lower inner dam formed on the first lower inner dam.

According to aspects of the present disclosure, the display apparatus may further include a planarization layer overlapped with the display area of the first substrate, an electroluminescent device formed on at least a portion of the planarization layer, and a bank configured to divide the electroluminescent device, wherein the first lower inner dam includes the same material as that of the planarization layer.

According to aspects of the present disclosure, the second lower inner dam may include the same material as that of the bank.

According to aspects of the present disclosure, the lower passivation layer may include at least one of a silicon nitride layer, a silicon oxide layer, or an aluminum oxide layer.

According to aspects of the present disclosure, the upper inner dam may include a first upper inner dam formed on the second substrate and configured to surround the display area, and a plurality of second upper inner dams formed on the first upper inner dam and spaced apart from each other.

According to aspects of the present disclosure, the first upper inner dam may include the same material as that of the planarization layer.

According to aspects of the present disclosure, the display apparatus may further include a color filter formed on the second substrate and overlapped with the electroluminescent device, and a black matrix configured to divide the color filter, wherein the second upper inner dam includes the same material as that of the black matrix.

According to aspects of the present disclosure, the upper passivation layer may include at least one of a silicon nitride layer, a silicon oxide layer, or an aluminum oxide layer.

According to aspects of the present disclosure, the lower passivation layer may include a first lower passivation layer configured to cover the planarization layer, the electroluminescent device, the bank, the first lower inner dam, and the second lower inner dam, and a second lower passivation layer configured to cover the first lower passivation layer.

According to aspects of the present disclosure, the first lower passivation layer may include a silicon nitride layer, and the second lower passivation layer may include at least one of a silicon oxide layer or an aluminum oxide layer.

According to aspects of the present disclosure, the first upper inner dam may include the same material as that of the black matrix.

According to aspects of the present disclosure, the first upper inner dam may include a stepped structure formed at a side facing the display area.

According to aspects of the present disclosure, the display apparatus may further include a lower outer dam configured to surround the lower inner dam, wherein the lower outer dam includes a first lower outer dam formed on the first substrate and configured to surround the first lower inner dam, and a second lower outer dam formed on the first lower outer dam.

According to aspects of the present disclosure, the first lower outer dam may include the same material as that of the first lower inner dam, and the second lower outer dam may include the same material as that of the second lower inner dam.

According to aspects of the present disclosure, the display apparatus may further include an upper outer dam configured to surround the upper inner dam, wherein the upper outer dam includes a first upper outer dam formed on the second substrate and configured to surround the second upper inner dam, and a second upper outer dam formed on the first upper outer dam.

According to aspects of the present disclosure, the first upper outer dam may include the same material as that of the planarization layer or the black matrix, and the second upper outer dam may include the same material as that of the second upper inner dam.

According to aspects of the present disclosure, the display apparatus may further include a sealing dam disposed between the lower inner dam and the lower outer dam, wherein the sealing dam contacts each of the first substrate and the second substrate.

The display apparatus according to the present disclosure may minimize the problems related with visible bubble defects generated in the panel by improving spreadability of the filling layer.

The display apparatus according to the present disclosure may minimize the defects caused when the filling layer is permeated into the sealing dam, and thus enables improved lifespan of the apparatus.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a first substrate in which a display area and a non-display area surrounding the display area are defined;
a second substrate facing the first substrate and overlapping with the first substrate;
a lower inner dam disposed on the first substrate and surrounding the display area;
an upper inner dam disposed on the second substrate and surrounding the display area;
an electroluminescent device on the first substrate, and including a first electrode, an electroluminescent layer and a second electrode;
a lower passivation layer covering the electroluminescent device and the lower inner dam, and directly connecting to the second electrode;
an upper passivation layer covering the upper inner dam; and
a filling layer positioned between the lower passivation layer and the upper passivation layer, and directly connecting to each of the lower passivation layer and the upper passivation layer,
wherein the lower passivation layer and the upper passivation layer are in contact with each other in an area where the lower inner dam and the upper inner dam overlap with each other,
wherein the lower inner dam comprises a first lower inner dam disposed on the first substrate and surrounding the display area, and a second lower inner dam disposed on the first lower inner dam,
wherein the upper inner dam includes a first upper inner dam disposed below the second substrate and surrounding the display area, and a plurality of second upper inner dams disposed below the first upper inner dam, protruding from the first upper inner dam, and spaced apart from each other,
wherein the upper passivation layer covers the plurality of second upper inner dams, wherein some of the plurality of second upper inner dams overlap with the second lower inner dam and the others of the plurality of second upper inner dams do not overlap with the second lower inner dam, wherein a portion of the upper passivation layer is only in contact with the lower passivation layer positioned on the second lower inner dam within an area where some of the plurality of second upper inner dams overlap with the second lower inner dam, wherein the filling layer is positioned between the plurality of second upper inner dams, and wherein the filling layer is positioned between the second lower inner dam and the first upper inner dam.

2. The display apparatus according to claim 1, further comprising:
a planarization layer overlapping with the display area of the first substrate;
a bank dividing the electroluminescent device, wherein the first lower inner dam is formed of a same material as the planarization layer.

3. The display apparatus according to claim 2, wherein the second lower inner dam is formed of a same material as the bank.

4. The display apparatus according to claim 3, further comprising a lower outer dam surrounding the lower inner dam.

5. The display apparatus according to claim 4, wherein the lower outer dam comprises:
a first lower outer dam disposed on the first substrate and surrounding the first lower inner dam; and
a second lower outer dam disposed on the first lower outer dam.

6. The display apparatus according to claim 4, wherein the first lower outer dam is formed of a same material as the first lower inner dam, and
wherein the second lower outer dam is formed of a same material as the second lower inner dam.

7. The display apparatus according to claim 4, further comprising a sealing dam disposed between the lower inner dam and the lower outer dam,
wherein the sealing dam is between the first substrate and the second substrate.

8. The display apparatus according to claim 7, wherein the sealing dam does not contact the filling layer.

9. The display apparatus according to claim 2, wherein the first upper inner dam is formed of a same material as the planarization layer.

10. The display apparatus according to claim 2, further comprising:
a color filter disposed below the second substrate and overlapping with the electroluminescent device; and
a black matrix dividing the color filter,
wherein the second upper inner dam is formed of a same material as the black matrix.

11. The display apparatus according to claim 10, wherein the first upper inner dam is formed of a same material as the black matrix.

12. The display apparatus according to claim 11, wherein the first upper inner dam includes a stepped structure disposed at a side facing the display area.

13. The display apparatus according to claim 10, further comprising an upper outer dam configured to surround the upper inner dam.

14. The display apparatus according to claim 13, wherein the upper outer dam comprises:
a first upper outer dam disposed below the second substrate and surrounding the second upper inner dam, and
a second upper outer dam disposed below the first upper outer dam.

15. The display apparatus according to claim 14, wherein the first upper outer dam is formed of a same material as the planarization layer or the black matrix, and
wherein the second upper outer dam is formed of a same material as the second upper inner dam.

16. The display apparatus according to claim 2, wherein the lower passivation layer comprises:
a first lower passivation layer covering the planarization layer, the electroluminescent device, the bank, the first lower inner dam, and the second lower inner dam; and
a second lower passivation layer covering the first lower passivation layer.

17. The display apparatus according to claim 16, wherein the first lower passivation layer includes a silicon nitride layer, and
wherein the second lower passivation layer includes one of a silicon oxide layer and an aluminum oxide layer.

18. The display apparatus according to claim 1, wherein the lower passivation layer includes one of a silicon nitride layer, a silicon oxide layer and an aluminum oxide layer.

19. The display apparatus according to claim 1, wherein the upper passivation layer includes one of a silicon nitride layer, a silicon oxide layer and an aluminum oxide layer.

20. The display apparatus according to claim 1, wherein a portion of the upper passivation layer is in contact with the second substrate in the non-display area,
another portion of the upper passivation layer covers the plurality of second upper inner dams and is in contact with the first upper inner dam between the plurality of second upper inner dams in the non-display area, and
a portion of the filling layer is surrounded by the upper passivation layer and the lower passivation layer between the second lower inner dam and the plurality of second upper inner dams.

* * * * *